United States Patent
Liu

(10) Patent No.: US 11,528,021 B2
(45) Date of Patent: Dec. 13, 2022

(54) DELAY LINE STRUCTURE AND DELAY JITTER CORRECTION METHOD THEREOF

(71) Applicant: Suzhou Motorcomm Electronic Technology Co., Ltd., Jiangsu Province (CN)

(72) Inventor: Yahuan Liu, Jiangsu Province (CN)

(73) Assignee: SUZHOU MOTORCOMM ELECTRONIC TECHNOLOGY CO., LTD., Jiangsu Province (CN)

( * ) Notice: Subject to any disclaimer, the term of this patent is extended or adjusted under 35 U.S.C. 154(b) by 0 days.

(21) Appl. No.: 17/537,727

(22) Filed: Nov. 30, 2021

(65) Prior Publication Data

US 2022/0209758 A1 Jun. 30, 2022

(30) Foreign Application Priority Data

Dec. 29, 2020 (CN) .......................... 202011584183.8

(51) Int. Cl.
| | |
|---|---|
| *H03L 7/06* | (2006.01) |
| *H03K 5/134* | (2014.01) |
| *H03L 7/081* | (2006.01) |
| *H03K 19/20* | (2006.01) |
| *H03K 5/00* | (2006.01) |

(52) U.S. Cl.
CPC ............. *H03K 5/134* (2014.07); *H03L 7/081* (2013.01); *H03K 19/20* (2013.01); *H03K 2005/00195* (2013.01)

(58) Field of Classification Search
CPC ................... H03K 5/134; H03K 19/20; H03K 2005/00195; H03L 7/081
USPC .......................................................... 327/158
See application file for complete search history.

(56) References Cited

U.S. PATENT DOCUMENTS

| | | | | |
|---|---|---|---|---|
| 5,355,037 | A * | 10/1994 | Andresen | G06F 1/10 327/158 |
| 7,135,906 | B2 * | 11/2006 | Takai | H03L 7/087 327/263 |
| 7,205,803 | B2 * | 4/2007 | Chung | H03K 5/133 327/158 |
| 7,230,498 | B2 * | 6/2007 | Osvaldella | H03K 5/133 327/158 |

(Continued)

FOREIGN PATENT DOCUMENTS

| | | |
|---|---|---|
| CN | 102684687 A | 9/2012 |
| CN | 104901656 A | 9/2015 |

*Primary Examiner* — Ryan Jager
(74) *Attorney, Agent, or Firm* — Harness, Dickey & Pierce, P.L.C.

(57) ABSTRACT

A delay line structure and a delay jitter correction method thereof are provided. The delay line structure comprises N delay units and N selectors. An output end of the N−1th delay unit is connected to a first input end of the N−1th selector and an input end of the Nth delay unit respectively, the N−1th selector inputs the N−1th selection signal, an output end of the Nth delay unit is connected to a first input end of the Nth selector, an output end of the Nth selector is connected to a second input end of the N−1th selector, and the Nth selector inputs the Nth selection signal. The time delay units and the selectors are stacked forwards according to the above-mentioned rule until the input ends of the first time delay units are connected with input signals and the output ends of the first selectors are connected with output signals.

11 Claims, 8 Drawing Sheets

(56) References Cited

U.S. PATENT DOCUMENTS

| | | | | |
|---|---|---|---|---|
| 7,394,300 | B2* | 7/2008 | Chae | H03H 11/26 |
| | | | | 327/263 |
| 7,486,125 | B2* | 2/2009 | Chae | H03K 5/131 |
| | | | | 327/272 |
| 8,115,532 | B2* | 2/2012 | Zhang | H03H 11/265 |
| | | | | 327/272 |
| 8,120,409 | B2* | 2/2012 | Keskin | H03K 5/131 |
| | | | | 327/158 |
| 8,279,015 | B2* | 10/2012 | Leistad | H03K 3/011 |
| | | | | 331/17 |
| 8,324,974 | B1* | 12/2012 | Bennett | G06F 1/324 |
| | | | | 331/44 |
| 8,400,201 | B2* | 3/2013 | Kojima | H03L 7/0814 |
| | | | | 327/264 |
| 9,692,399 | B2* | 6/2017 | Cheng | H03K 5/14 |
| 9,864,720 | B2* | 1/2018 | Chae | G06F 13/4243 |
| 10,277,215 | B2* | 4/2019 | Tsai | H03K 5/133 |
| 10,998,911 | B1* | 5/2021 | Abughazaleh | H03L 7/087 |
| 11,031,924 | B1* | 6/2021 | Cheng | H03K 3/038 |
| 11,126,217 | B1* | 9/2021 | Tseng | G06F 1/12 |
| 11,153,129 | B1* | 10/2021 | Toprak-Deniz | H04L 25/03044 |
| 11,283,430 | B2* | 3/2022 | Wu | H03K 19/20 |
| 2007/0008023 | A1* | 1/2007 | Wang | H03K 5/133 |
| | | | | 327/276 |
| 2021/0409008 | A1* | 12/2021 | Wu | H03K 3/0315 |

* cited by examiner

US 11,528,021 B2

DELAY LINE STRUCTURE AND DELAY JITTER CORRECTION METHOD THEREOF

CROSS REFERENCE TO RELATED APPLICATION

This application claims the benefit and priority of Chinese Patent Application No. 2020115841838 filed Dec. 29, 2020. The entire disclosure of the above application is incorporated herein by reference.

FIELD

The invention relates to the field of digital communication technology, and more particularly, to a delay line structure and a delay jitter correction method thereof.

BACKGROUND

In the modern communication networks, the transmission rate at chip interfaces is getting increasingly faster due to the increase in data rates. For the conventional digital interface, transmission of data is done on the rising edge or the falling edge of the clock only. In order to increase the transmission rate, if transmission of data is done both on the rising edge and the falling edge of the clock without changing the frequency of the clock, the data transmission rate will be doubled. Take the timing of the Ethernet transmission interface RGMII as an example, as shown in FIG. 1, RXC is a channel associated clock, RXD/RX_CTL is channel associated data, and it can be seen that data jumps on the rising and falling edge of RXC. Assuming that the RXC jump edge of the sending end is completely aligned with the jump edge of the data, the receiving end needs to delay the clock so that the jump edge of the clock is exactly in the middle of the jump edge of the adjacent data in order to receive the data correctly. Alternatively, RXC is sent out after the sending end delays RXC, then the receiving end does not need to delay RXC. The phase of the signal seen by the receiving end is also affected by the wiring on the board. Therefore, in order to ensure that the received signal can be received correctly in the application, control of delay line is also included at the sending end or the receiving end to meet the requirement of timing of receiving.

SUMMARY

An object of the present invention is to provide a delay line structure and a delay jitter correction method thereof, so as to provided a delay line in which delay control can be carried out on the clock at the sending end or the receiving end, to meet the requirement of timing of receiving, and the jitter of the delay of the delay line can be reduced.

For the above-mentioned purpose, the invention adopts the following technical solutions:

a delay line structure, comprising N delay units and N selectors, an output end of the N−1th delay unit is connected to a first input end of the N−1th selector and an input end of the Nth delay unit, respectively, the N−1th selector inputs the N−1th selection signal, an output end of the Nth delay unit is connected to a first input end of the Nth selector, an output end of the Nth selector is connected to a second input end of the N−1th selector, and the Nth selector inputs the Nth selection signal, each of the time delay units and each of the selectors are stacked forwards according to the above-mentioned rule until the input ends of the first time delay units are connected with input signals and the output ends of the first selectors are connected with output signals.

In the above-mentioned technical solution, each of delay units comprises two cascaded first inverters.

In the above-mentioned technical solution, each of the first inverters comprises a first PMOS transistor and a first NMOS transistor connected in series between VCC and ground.

In the above-mentioned technical solution, each of the selectors comprises a first NAND gate, a second NAND gate, a third NAND gate and a second inverter, a second input end of the first NAND gate is connected to a second input end of the second NAND gate via the second inverter, an output end of the first NAND gate is connected to a first input end of the third NAND gate, and an output end of the second NAND gate is connected to a second output end of the third NAND gate.

In the above-mentioned technical solution, the first NAND gate, the second NAND gate, and the third NAND gate have the same structure, the first NAND gate comprises a first NPN transistor, a second NPN transistor, a first PNP transistor and a second PNP transistor;

a collector of the first NPN transistor is connected to VCC, a base of the first NPN transistor is connected to a base of the first PNP transistor and serves as the first input end of the first NAND gate, an emitter of the first NPN transistor is connected to an emitter of the second NPN transistor and a collector of the first PNP transistor, respectively, and serves as an output end of the first NAND gate, a collector of the second NPN transistor is connected to VCC, a base of the second NPN transistor is connected to a base of the second PNP transistor and serves as the second input end of the first NAND gate, an emitter of the first PNP transistor is connected to a collector of the second PNP transistor, and an emitter of the second PNP transistor is grounded.

In the above-mentioned technical solution, the second inverter comprise a second PMOS transistor and a second NMOS transistor connected in series between VCC and ground.

The invention also provides a delay jitter correction method of a delay line, comprising the steps of:

Step 1, obtaining a set of clock signals having a fixed phase relationship through a Phase-locked-Loop (PLL) circuit, wherein the set of clock signals comprise a 0-degree clock signal clk_0 and a 90-degree clock signal clk_90;

Step 2, inputting the 0-degree clock signal clk_0 into the delay line to obtain a 0-degree clock delay signal clk_0_delay;

Step 3, inputting the 0-degree clock delay signal clk_0_delay into a D trigger and collecting the 0-degree clock delay signal clk_0_delay using the 90-degree clock signal clk_90;

Step 4, inputting an output signal of the D trigger into a judgment module to obtain a delay setting of the delay line.

In the above-mentioned technical solution, in Step 4, the number of the delay setting of the delay line is increase one by one when an output of the D trigger is at a high level, and a delay setting when the output of the D trigger is at a low level is the delay setting of the delay line.

By adopting the above-mentioned technical solutions, the present invention has the beneficial effects that a combination of a plurality of delay units and a plurality of selectors makes it possible for the delay line disclosed in the present invention to output delay signals from different delay units, and the jitter of the delay of the delay line can be reduced by using the correction method provided herein.

DETAILED DESCRIPTION

The present invention will now be described fully hereinafter with reference to the accompanying drawings and the embodiments of the present invention.

EXAMPLE

Figure 1:
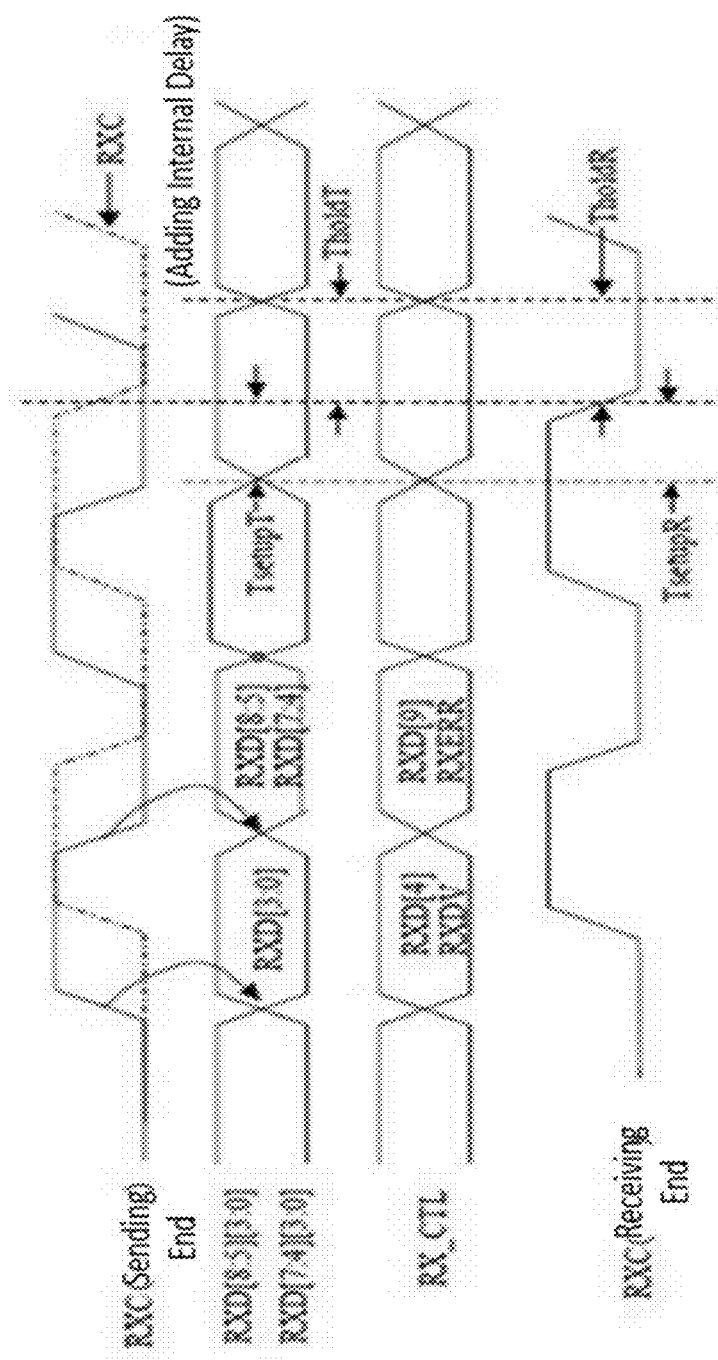
FIG. 1 is a schematic diagram of a timing of the Ethernet transmission interface RGMII indicated in the section of Description of the Related Art according to the present invention.
Figure 2:
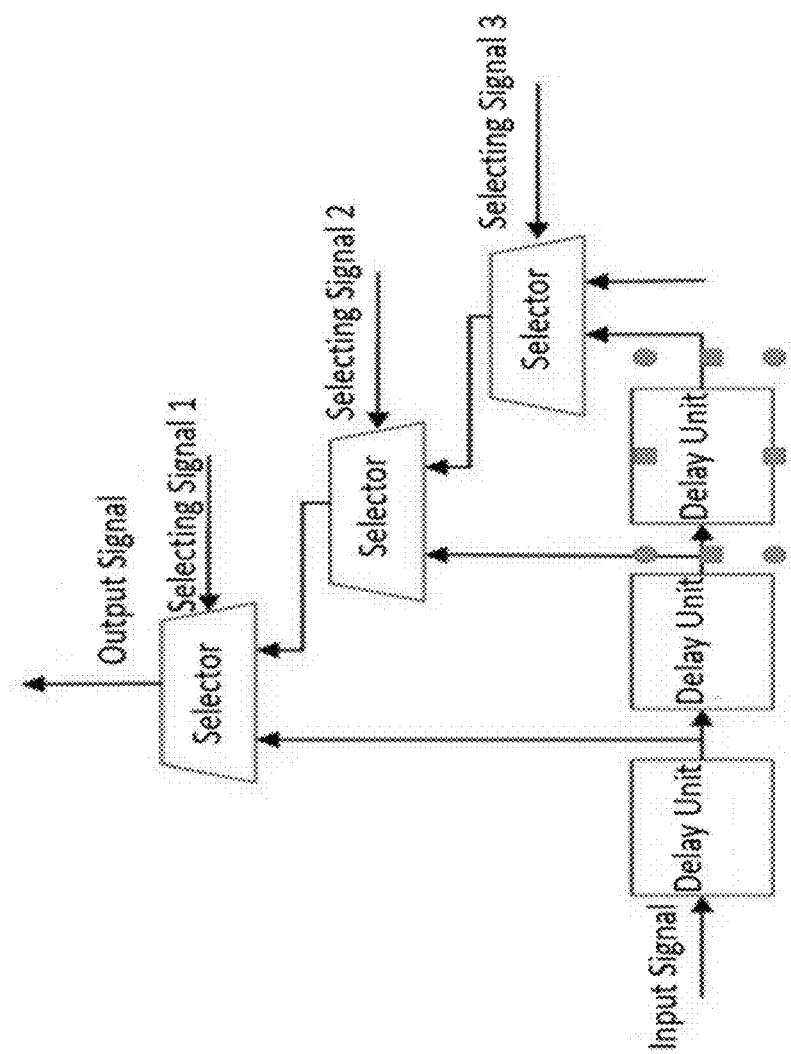
FIG. 2 is a schematic diagram showing a structure of a delay line according to the present invention.

Referring to FIG. 2, the invention relates to a delay line structure. The delay line structure is implemented based on selectors. In particular, the delay line structure comprises N delay units and N selectors. An output end of the N−1th delay unit is connected to a first input end of the N−1th selector and an input end of the Nth delay unit, respectively, the N−1th selector inputs the N−1th selection signal, an output end of the Nth delay unit is connected to a first input end of the Nth selector, an output end of the Nth selector is connected to a second input end of the N−1th selector, and the Nth selector inputs the Nth selection signal. Each of the time delay units and each of the selectors are stacked forwards according to the above-mentioned rule until the input ends of the first time delay units are connected with input signals and the output ends of the first selectors are connected with output signals.

Assuming the delay of a combination of a delay unit and a selector in the above-mentioned delay line is T, the delay of the connecting line can be ignored. When the first selector selects an output signal of the second selector and the second selector selects an output signal of the second delay unit, the delay of the delay line is 2T; when the first selector selects an output signal of the second selector, the second selector selects an output signal of the third selector, and the third selector selects an output signal of the third delay unit, the delay of the delay line is 3T. As such, the delay N*T can be obtained by increasing the stages of delay unit and selector.

Figure 3:
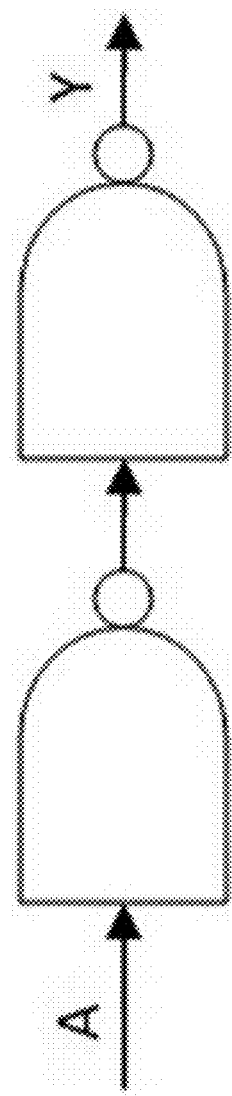
FIG. 3 is a schematic diagram showing a structure of a delay unit according to the present invention.

In particular, as shown in FIG. 3, each of delay units comprises two cascaded first inverters.

Figure 4:
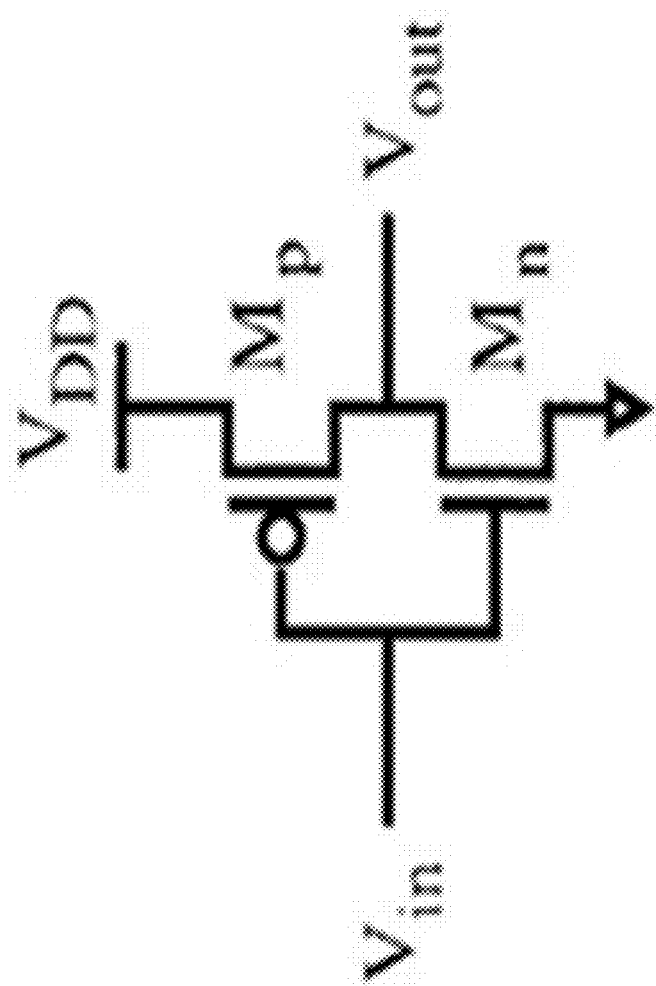
FIG. 4 is a schematic diagram showing a structure of a first inverter according to the present invention.

With reference to FIG. 4, each of the first inverters comprises a first PMOS transistor Mp and a first NMOS transistor Mn connected in series between VCC and ground.

Figure 5:
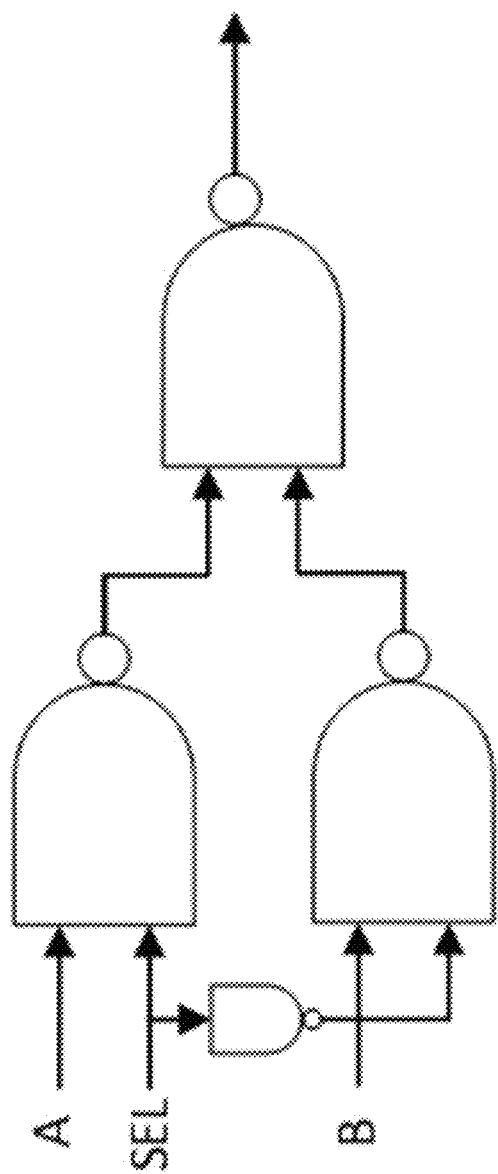
FIG. 5 is a schematic diagram showing a structure of a selector according to the present invention.

As shown in FIG. 5, each of the selectors comprises a first NAND gate, a second NAND gate, a third NAND gate and a second inverter, a second input end of the first NAND gate is connected to a second input end of the second NAND gate via the second inverter, an output end of the first NAND gate is connected to a first input end of the third NAND gate, and an output end of the second NAND gate is connected to a second output end of the third NAND gate; the second inverter has a structure similar to that of the first inverter.

Figure 6:
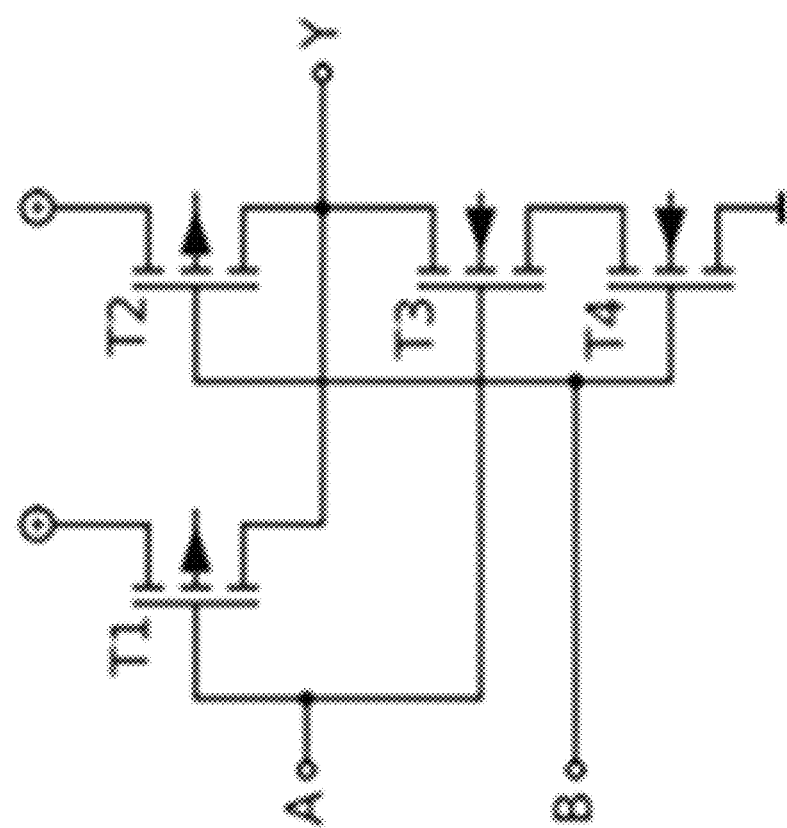
FIG. 6 is a schematic diagram showing structures of NAND gates according to the present invention.

The first NAND gate, the second NAND gate, and the third NAND gate have the same structure. As shown in FIG. 6, the first NAND gate comprises a first NPN transistor T1, a second NPN transistor T2, a first PNP transistor T3 and a second PNP transistor T4;

a collector of the first NPN transistor T1 is connected to VCC, a base of the first NPN transistor T1 is connected to a base of the first PNP transistor T3 and serves as the first input end of the first NAND gate, an emitter of the first PNP transistor T1 is connected to an emitter of the second NPN transistor T2 and a collector of the first PNP transistor T3, respectively, and serves as an output end of the first NAND gate, a collector of the second NPN transistor T2 is connected to VCC, a base of the second NPN transistor T2 is connected to a base of the second PNP transistor T4 and serves as the second input end of the first NAND gate, an emitter of the first PNP transistor T3 is connected to a collector of the second PNP transistor T4, and an emitter of the second PNP transistor T4 is grounded.

Figure 7:
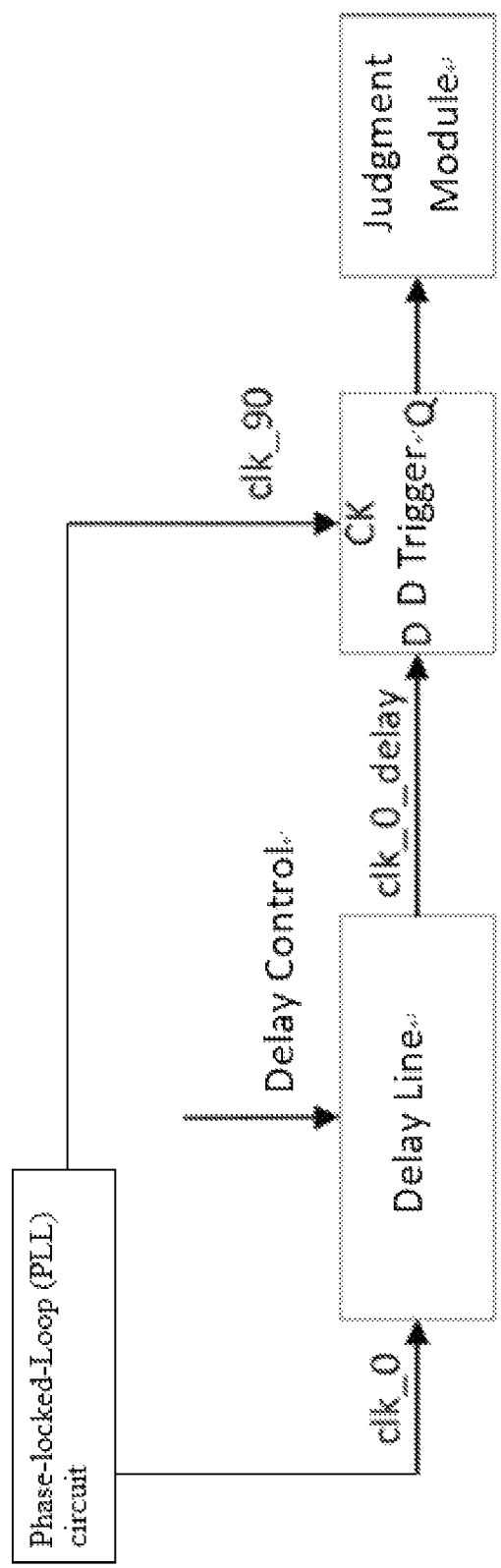
FIG. 7 is a schematic diagram of a correction method according to the present invention.

However, the actual delay in the actual circuit is not constant. Due to the deviation occurred during the manufacturing process, the delay of each chip under the same environment will be different; the delay of the same chip may also change when it is at a different temperature and voltage. Generally, the range of delay between the delay unit and the selector is very large, and the ratio of the maximum value to the minimum value can be 3-5 times. For example, the typical value of delay of a group of delay units and selectors is 150 ps, the delay can be 90 ps and 350 ps at a certain minimum value and a maximum value. Assuming a delay of 2 ns is needed, the 13-level delay is 1.95 ns if calculated with a typical value, while delay is 1.17 ns and 4.5 ns, respectively if calculated with a minimum value and a maximum value. Taking RGMII as an example, the clock cycle is 8 ns, and the interval between rising and falling edges is 4 ns. Ideally, the delay of the clock is between 1.5 ns and 2.5 ns. Changes found in the delay line are inefficient for meeting the requirements. Therefore, the invention also relates to a delay jitter correction method of a delay line. As shown in FIG. 7, the method comprises the steps of:

Step 1, obtaining a set of clock signals having a fixed phase relationship through a Phase-locked-Loop (PLL) circuit, wherein the set of clock signals comprise a 0-degree clock signal clk_0 and a 90-degree clock signal clk_90;

Step 2, inputting the 0-degree clock signal clk_0 into the delay line to obtain a 0-degree clock delay signal clk_0_delay;

Step 3, inputting the 0-degree clock delay signal clk_0_delay into a D trigger and collecting the 0-degree clock delay signal clk_0_delay using the 90-degree clock signal clk_90;

Step 4, inputting an output signal of the D trigger into a judgment module to obtain a delay setting of the delay line.

Figure 8:
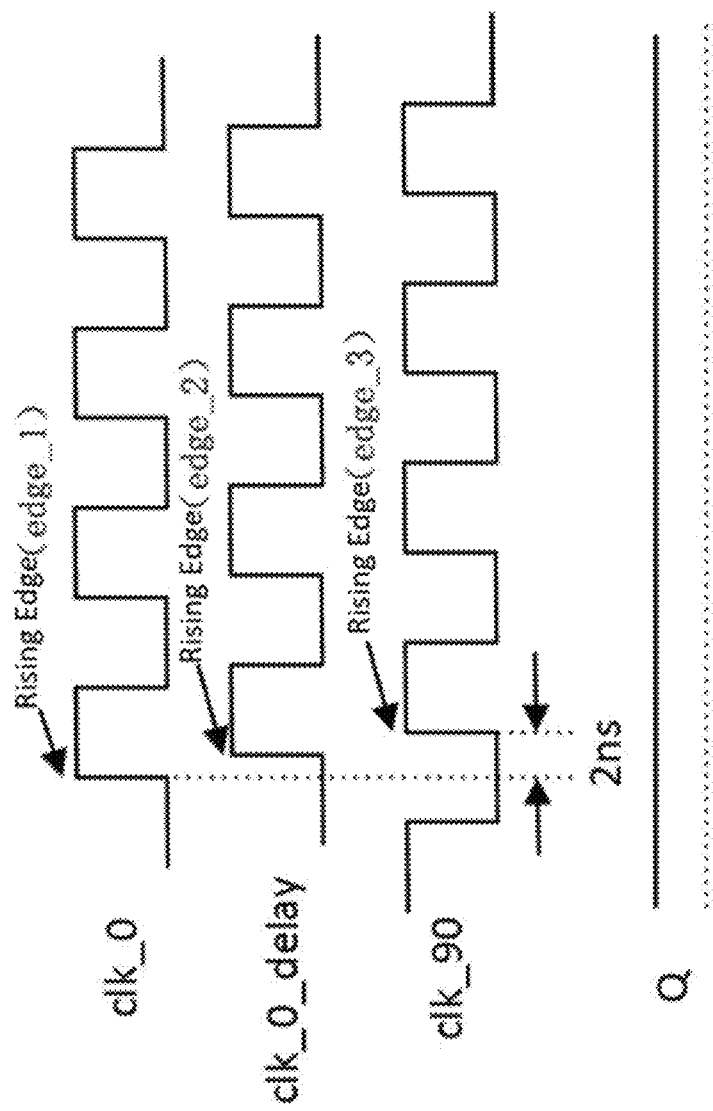
FIG. 8 is a schematic diagram showing timing of all clocks in a judgment module according to the present invention.

For ease of understanding, a 125 M clock is taken as an example to obtain a combination of a 0-degree clock and a 90-degree clock. The clock period is 8 ns, and the 90-degree phase difference is converted into a time delay of 2 ns. Referring again to FIG. 3, the 0-degree clock signal clk_0 is passed through the delay line to obtain a 0-degree clock delay signal clk_0_delay, and then the 90-degree clock signal clk_90 is used to collect the 0-degree clock delay signal clk_0_delay through a D trigger. Then the output of the D trigger is judged. In the judgment module, the timing relationship of all the clocks is shown in FIG. 8.

In particular, by using the D trigger, the 90-degree clock signal clk_90 is used as the clock to collect the 0-degree clock delay signal clk_0_delay, when the rising edge edge_2 of the 0-degree clock delay signal clk_0_delay is between the rising edge_1 of the 0-degree clock signal clk_0 and the rising edge_3 of the 90-degree clock signal clk_90, at the rising edge of the 90-degree clock signal clk_90, the 0-degree clock delay signal clk_0_delay is always high, so the output of the D trigger is always high, then the setting of the delay line starts from delay 1*T. If the output of the D trigger is always high, the delay of the delay line is increased until the output of the D trigger is at a low level, and write down the setting N of the delay line at the same time. Taking into account the setup time requirements $T_{setup}$ of the D trigger (data on the D terminal should be earlier than trigger edge on the CK terminal to ensure that the data on the D terminal is collected correctly), the following information can be obtained:

$$(N-1)*T \approx (2 - T_{setup})$$

The reason for using the symbol of approximately equal to is that the delay line adjustment resolution is T, and there may be ambiguity of time T. Therefore, each delay of the delay line can be obtained under current conditions is as follows:

$$T \approx \frac{(2 - T_{setup})}{(N - 1)}$$

A desired setting corresponding to the delay $T_{expect}$ can be calculated with the information of the each delay of the delay line.

$$M \approx \frac{T_{expect}}{T}$$

The disclosed embodiments are described to enable those skilled in the art should be able to practice the invention. Various modifications to the embodiments are apparent to those skilled in the art. The general principle defined herein can be realized in other embodiments without departing from the spirit and scope of the invention. Thus, the invention is not limited to the above-mentioned embodiments set forth herein, but rather to be consistent with the principle and novelty disclosed herein in the broadest possible manner.

What is claimed is:

1. A delay jitter correction method of a delay line for correcting delay jitter of a delay line structure, the delay line structure comprising: N delay units and N selectors, wherein an output end of the N−1th delay unit is connected to a first input end of the N−1th selector and an input end of the Nth delay unit, the N−1th selector inputs a N−1th selection signal, an output end of the Nth delay unit is connected to a first input end of the Nth selector, an output end of the Nth selector is connected to a second input end of the N−1th selector, and the Nth selector inputs a Nth selection signal, each of the delay units and each of the selectors are stacked forwards according to the above-mentioned rule until the input ends of the first delay units are connected with input signals and the output ends of the first selectors are connected with output signals; the delay jitter correction method comprising the steps of:

Step 1, obtaining a set of clock signals having a fixed phase relationship through a Phase-locked-Loop (PLL) circuit, wherein the set of clock signals comprise a 0-degree clock signal clk_0 and a 90-degree clock signal clk_90;

Step 2, inputting the 0-degree clock signal clk_0 into the delay line to obtain a 0-degree clock delay signal clk_0_delay;

Step 3, inputting the 0-degree clock delay signal clk_0_delay into a D trigger and collecting the 0-degree clock delay signal clk_0_delay using the 90-degree clock signal clk_90; and Step 4, inputting an output signal of the D trigger into a judgment module to obtain a delay setting of the delay line.

2. The delay jitter correction method of a delay line of claim 1, wherein in Step 4, the number of the delay setting of the delay line is increased one by one when an output of the D trigger is at a high level, and a delay setting when the output of the D trigger is at a low level is the delay setting of the delay line.

3. The delay jitter correction method of a delay line of claim 1, wherein each of the selectors comprises a first NAND gate, a second NAND gate, a third NAND gate and a second inverter, a second input end of the first NAND gate is connected to a second input end of the second NAND gate via the second inverter, an output end of the first NAND gate is connected to a first input end of the third NAND gate, and an output end of the second NAND gate is connected to a second input end of the third NAND gate.

4. The delay jitter correction method of a delay line of claim 3, wherein the first NAND gate, the second NAND gate, and the third NAND gate have the same structure, the first NAND gate comprises a first NPN transistor, a second NPN transistor, a first PNP transistor and a second PNP transistor; and wherein a collector of the first NPN transistor is connected to VCC, a base of the first NPN transistor is connected to a base of the first PNP transistor and serves as the first input end of the first NAND gate, an emitter of the first NPN transistor is connected to an emitter of the second NPN transistor and a collector of the first PNP transistor, respectively, and serves as an output end of the first NAND gate, a collector of the second NPN transistor is connected to VCC, a base of the second NPN transistor is connected to a base of the second PNP transistor and serves as the second input end of the first NAND gate, an emitter of the first PNP transistor is connected to a collector of the second PNP transistor, and an emitter of the second PNP transistor is grounded.

5. The delay jitter correction method of a delay line of claim 3, wherein the second inverter comprises a second PMOS transistor and a second NMOS transistor connected in series between VCC and ground.

6. A delay jitter correction method of a delay line for correcting delay jitter of a delay line structure, the delay line structure comprising: N delay units and N selectors, wherein an output end of the N−1th delay unit is connected to a first input end of the N−1th selector and an input end of the Nth delay unit, the N−1th selector inputs a N−1th selection signal, an output end of the Nth delay unit is connected to a first input end of the Nth selector, an output end of the Nth selector is connected to a second input end of the N−1th selector, and the Nth selector inputs a Nth selection signal, each of the delay units and each of the selectors are stacked forwards according to the above-mentioned rule until the input ends of the first delay units are connected with input signals and the output ends of the first selectors are connected with output signals, each of the delay units comprises two cascaded first inverters; the delay jitter correction method comprising the steps of:

Step 1, obtaining a set of clock signals having a fixed phase relationship through a Phase-locked-Loop (PLL) circuit, wherein the set of clock signals comprise a 0-degree clock signal clk_0 and a 90-degree clock signal clk_90;

Step 2, inputting the 0-degree clock signal clk_0 into the delay line to obtain a 0-degree clock delay signal clk_0_delay;

Step 3, inputting the 0-degree clock delay signal clk_0_delay into a D trigger and collecting the 0-degree clock delay signal clk_0_delay using the 90-degree clock signal clk_90; and Step 4, inputting an output signal of the D trigger into a judgment module to obtain a delay setting of the delay line.

7. The delay jitter correction method of a delay line of claim 6, wherein in Step 4, the number of the delay setting of the delay line is increased one by one when an output of the D trigger is at a high level, and a delay setting when the output of the D trigger is at a low level is the delay setting of the delay line.

8. The delay jitter correction method of a delay line of claim 6, wherein each of the first inverters comprises a first PMOS transistor and a first NMOS transistor connected in series between VCC and ground.

9. The delay jitter correction method of a delay line of claim 6, wherein each of the selectors comprises a first NAND gate, a second NAND gate, a third NAND gate and a second inverter, a second input end of the first NAND gate is connected to a second input end of the second NAND gate via the second inverter, an output end of the first NAND gate is connected to a first input end of the third NAND gate, and an output end of the second NAND gate is connected to a second input end of the third NAND gate.

10. The delay jitter correction method of a delay line of claim 9, wherein the first NAND gate, the second NAND gate, and the third NAND gate have the same structure, the first NAND gate comprises a first NPN transistor, a second NPN transistor, a first PNP transistor and a second PNP transistor; and wherein a collector of the first NPN transistor is connected to VCC, a base of the first NPN transistor is connected to a base of the first PNP transistor and serves as the first input end of the first NAND gate, an emitter of the first NPN transistor is connected to an emitter of the second NPN transistor and a collector of the first PNP transistor, respectively, and serves as an output end of the first NAND gate, a collector of the second NPN transistor is connected to VCC, a base of the second NPN transistor is connected to a base of the second PNP transistor and serves as the second input end of the first NAND gate, an emitter of the first PNP transistor is connected to a collector of the second PNP transistor, and an emitter of the second PNP transistor is grounded.

11. The delay jitter correction method of a delay line of claim 9, wherein the second inverter comprises a second PMOS transistor and a second NMOS transistor connected in series between VCC and ground.

\* \* \* \* \*